United States Patent [19]

Chang et al.

[11] Patent Number: 4,782,312

[45] Date of Patent: Nov. 1, 1988

[54] MODE SELECTIVE MAGNETOSTATIC WAVE RESONATORS

[75] Inventors: Kok-Wai Chang, Sunnyvale, Calif.; Giuseppe Miccoli, Rome, Italy; Waguih S. Ishak, Cupertino, Calif.

[73] Assignee: Hewlett-Packard Company, Palo Alto, Calif.

[21] Appl. No.: 94,963

[22] Filed: Oct. 22, 1987

[51] Int. Cl.⁴ .......................... H01P 7/06; H01P 7/08
[52] U.S. Cl. ..................................... 333/219; 333/202; 333/204; 333/228; 333/235
[58] Field of Search ............. 333/24.2, 202, 204, 333/205, 219, 148, 149, 228, 201, 235; 331/96, 107 DP, 117 D

[56] References Cited

U.S. PATENT DOCUMENTS

| | | | |
|---|---|---|---|
| 4,316,162 | 2/1982 | Volluet et al. | 333/201 |
| 4,392,115 | 7/1983 | Volluet et al. | 333/149 X |
| 4,395,686 | 7/1983 | Adam | 333/148 X |
| 4,528,529 | 7/1985 | Huijer | 333/219 |
| 4,547,754 | 10/1985 | Murakami et al. | 333/24.1 X |
| 4,565,984 | 1/1986 | Castera et al. | 333/202 X |
| 4,614,923 | 9/1986 | Roveda et al. | 333/24.2 |

Primary Examiner—Marvin L. Nussbaum
Attorney, Agent, or Firm—John A. Frazzini

[57] ABSTRACT

A resonator in which the input and output transducers are positioned to couple strongly into a resonant mode of interest. Signal drains are included to drain energy out of spurious resonant modes. In a magnetostatic wave resonator, the signal drains are preferably grooves in the surface of the ferrimagnetic film forming the resonator cavity.

15 Claims, 7 Drawing Sheets

MODE SELECTIVE MAGNETOSTATIC WAVE RESONATORS

BACKGROUND OF THE INVENTION

Figure 1:
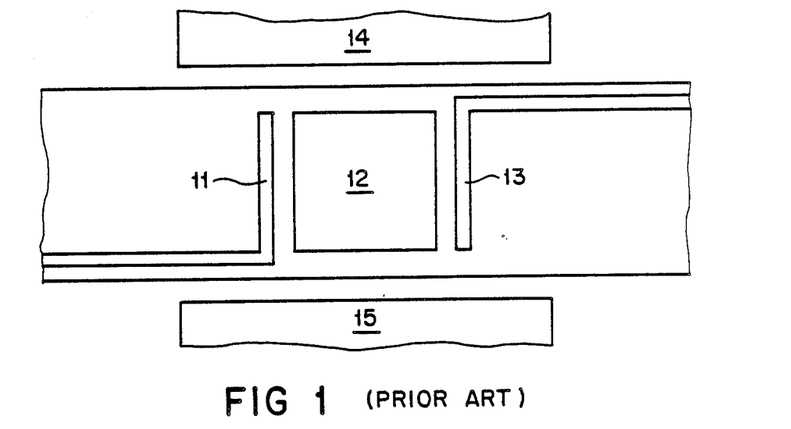
In FIG. 1 is presented an existing type of magnetostatic wave resonator.

This invention relates in general to Magnetostatic Wave (MSW) Resonators and relates more particularly to an MSW resonator having designed in suppression of spurious modes. In U.S. Pat. No. 4,528,529 entitled MAGNETOSTATIC WAVE RESONATOR issued to Ernst Huijer on July 9, 1985, an MSW resonator is presented in which a rectangular block 12 of yttrium-iron-garnet (YIG) film is positioned between a pair of microstrip conductors 11 and 13 that function as input and output transducers of the resonator. A magnetic field is applied to the block of thin film by a pair of magnetic poles 14 and 15. This resonator is illustrated in FIG. 1. In response to an oscillatory input signal in the input transducer 11, magnetostatic waves are launched in the rectangular block 12 of YIG film and induce in the output transducer 13 an output signal. The waves reflect from the ends and sides of the rectangular block of YIG film, producing constructive and destructive interference patterns that result in resonant responses in the output transducer.

In general, resonance modes will result at those frequencies for which there is an integral number m of half wavelengths in an x-direction perpendicular to the transducers and an integral number n of half wavelengths in a y-direction parallel to the transducers. Typically, it is desirable in a resonator to have only a single resonance mode coupling the input transducer to the output transducer. In the resonator presented by Huijer, all but the dominant modes are suppressed by spacing them away from the resonant cavity in either the x or y directions. However, such spacing reduces the coupling of the transducers to the magnetostatic waves in the block of YIG film, thereby reducing the transfer coefficient between the input and output transducers. In addition, there is only a small reduction in the nondominant (i.e., spurious) modes. Therefore, a more effective manner of spurious mode suppression would be advantageous.

SUMMARY OF THE INVENTION

In accordance with the illustrated preferred embodiment of the invention, a magnetostatic wave (MSW) resonator of the type developed by Huijer is presented in which spurious modes in the MSW resonator are suppressed by carefully selecting the locations of the input and output transducers. These transducers are selected to be substantially centered on one of the peaks of the selected resonant mode. These locations are also preferably selected to be located away from the peaks of the lowest order spurious modes.

Further spurious mode suppression is achieved by careful placement of one or more grooves in the surface of the YIG film. In general, the location of each groove is selected to substantially center that groove over a peak of the spurious mode that is to be suppressed by that groove. The width and depth of each groove is also adjusted to optimize the suppression of the spurious modes.

DESCRIPTION OF THE PREFERRED EMBODIMENT

Figure 2:
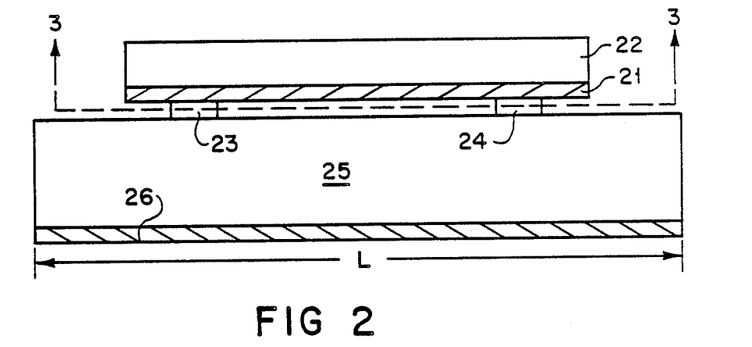
In FIG. 2 is shown a side view of a magnetostatic wave resonator.

In FIG. 2 is shown a side view of a magnetostatic wave (MSW) resonator having inherent suppression of spurious resonant modes. A rectangular block 21 of a thin film (on the order of 10–200 microns) of a ferrimagnetic material, such as yttrium iron garnet (YIG), is formed on a dielectric substrate 22, such as gadolinium gallium garnet (GGG). A pair of transducers, such as metallic microstrips 23 and 24, are formed on block 21 and function as input and output transducers, respectively, of the resonator. This structure is then mounted as shown on a dielectric substrate 25 having a conductive ground plane 26. A external magnet (not shown) applies a magnetic field to block 21. This field if typically applied perpendicular to either the top, side or end of block 21 and the direction of application determines the type of magnetostatic waves that are launched in block 21.

Figure 3:
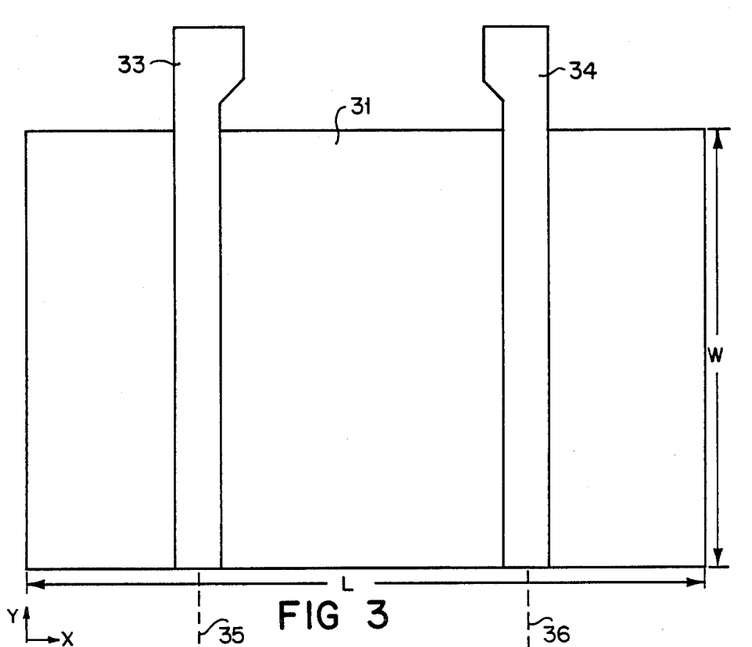
In FIG. 3 is shown a cross-sectional view of the resonator of FIG. 2.

In FIG. 3 is shown a cross-sectional view of the resonator. Input signals applied to input transducer 33 launch magnetostatic waves in block 31. These waves reflect from the ends and sides of the block of block 31 forming resonant mode standing waves. The length L and the width W are selected to produce resonant modes at frequencies of interest. In general, the resonant modes have the form $A*\sin(k_x x)*\sin(k_y y)$, where $k_x = m\pi/L$, where $K_y = n\pi/W$, and where m and n are positive integers. This mode will be indicated herein as the (m,n) resonant mode.

Figure 4:
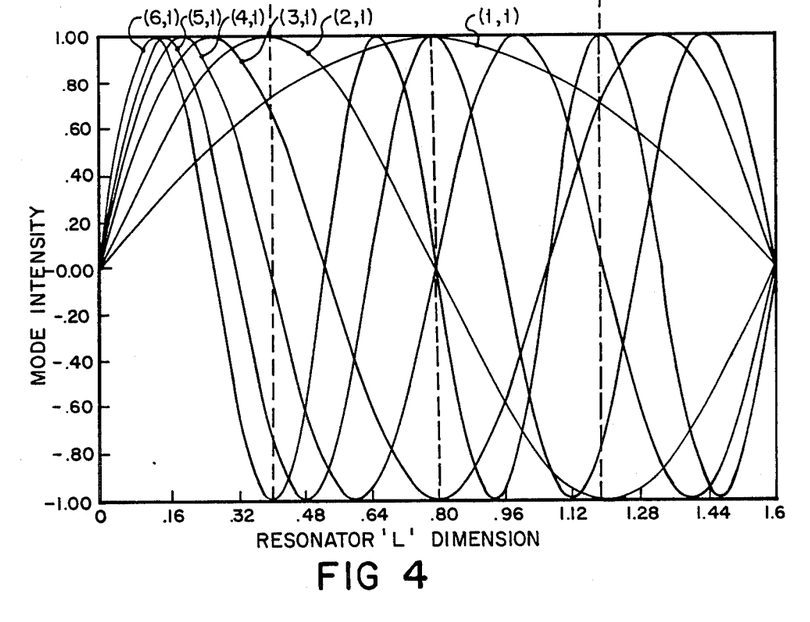
In FIG. 4 is shown the sine wave pattern of the resonant modes along a line of constant y.

In FIG. 4 are shown, along a line of constant y, the shapes of the (m,1) resonant modes, for m=1, ..., 6. Typically, in a resonator, it is advantageous to excited substantially only one resonant mode. If only one mode is excited, then the transfer function between input transducer 33 and output transducer 34 has a single resonant peak. Unfortunately, the resonator by Huijer, presented in the Background of the Invention, excites several modes fairly strongly. These other modes typically overlap the mode of interest and therefore represent spurious modes that interfere with ideal operation of the resonator near the resonant frequency of the resonant mode of interest.

Figure 5:
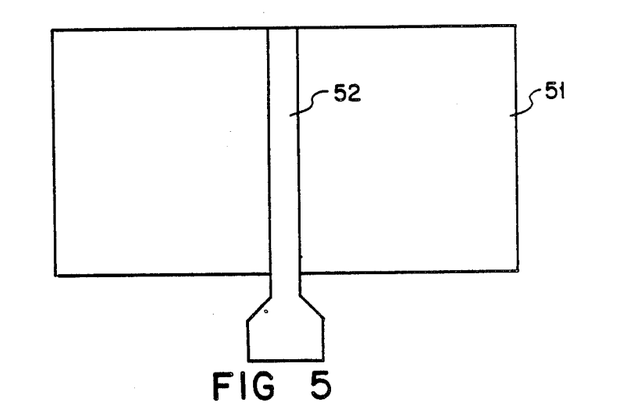
In FIG. 5 is shown a one port resonator in which the input transducer is located over the center of the (1,n) resonant mode.

In the resonator of FIGS. 3 and 4, the input transducer 33 is positioned to most strongly stimulate the resonant mode of interest and the output transducer is positioned to most strongly couple to this resonant mode of interest. This is achieved by locating the input and output transducers over peaks in the resonant mode of interest. Because the (1,1) mode has only a single peak, if this mode were selected as the mode of interest, then the input and output transducers would both be located over this peak. In FIG. 5 is shown a one-port transducer in which a single transducer 52 that passes over the center of YIG block 51 serves as both the input and output transducers. Because the (1,1) resonant peak is located at the center of block 51, this single transducer is located over the peak of the (1,1) resonant mode.

Figure 6:
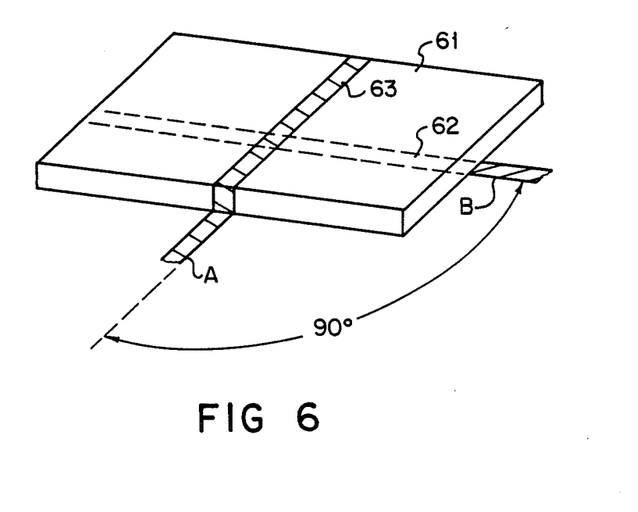
In FIG. 6 is shown a two port resonator in which the input and output transducers are both located over the same peak of the (1,n) resonant mode.
Figure 7:
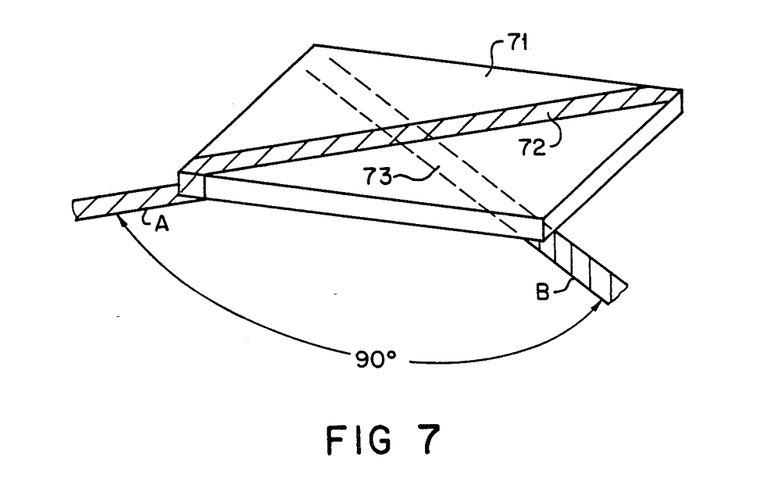
In FIG. 7 is shown an alternate embodiment of a two port resonator in which the input and output transducers are both located over the center peak of the (1,n) resonant mode for n odd.
Figure 8:
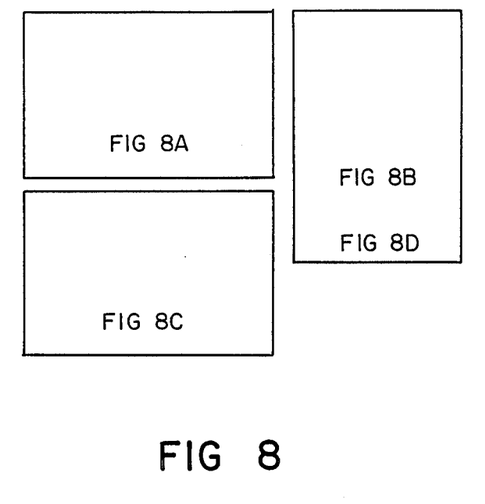
In FIG. 8 is illustrated how to arrange the sheets of FIGS. 8A–8D to illustrate the operation of the embodiment of FIG. 8A.
Figure 8A:
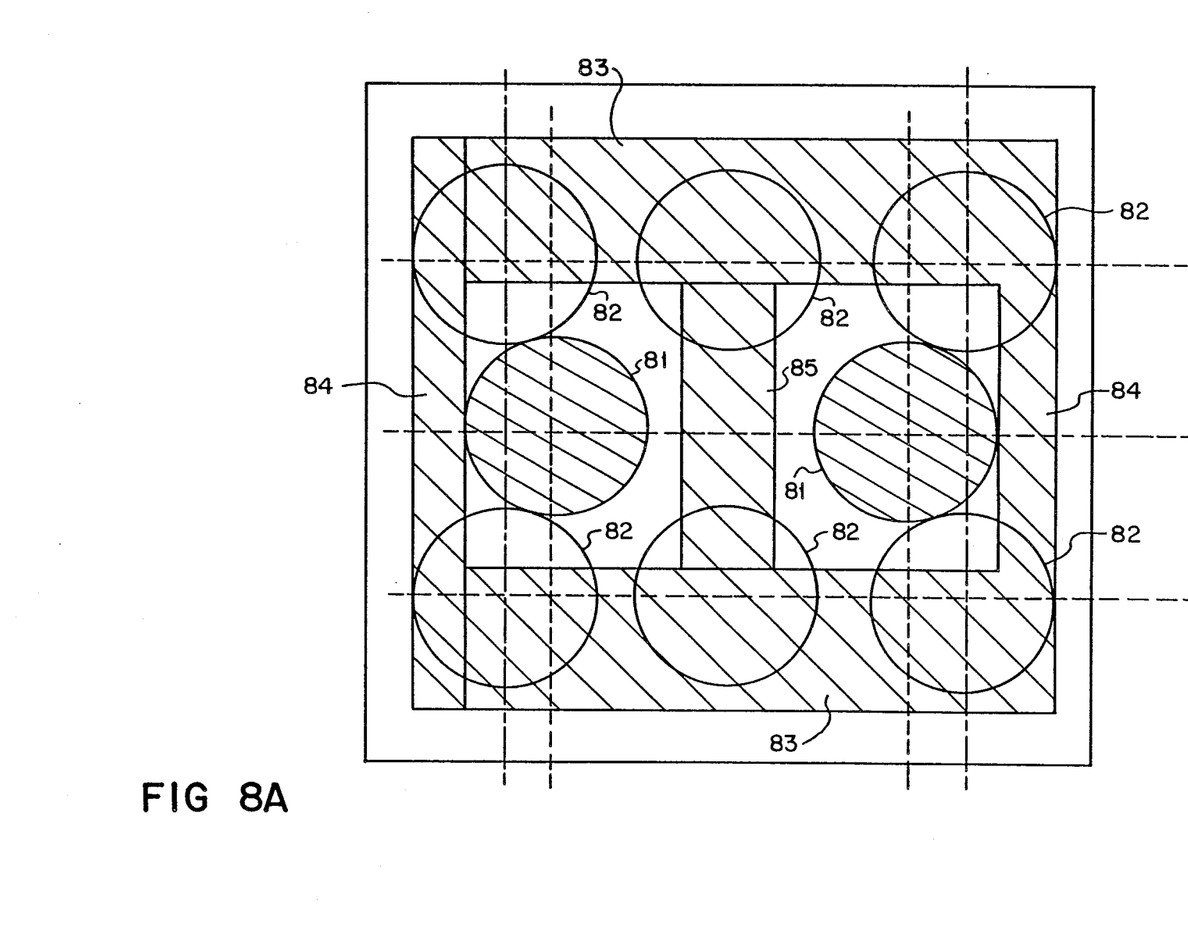
In FIG. 8A is illustrated where signal drains should be positioned to avoid degrading the resonant mode of interest and to suppress some selected major spurious resonant modes.
Figure 8B:
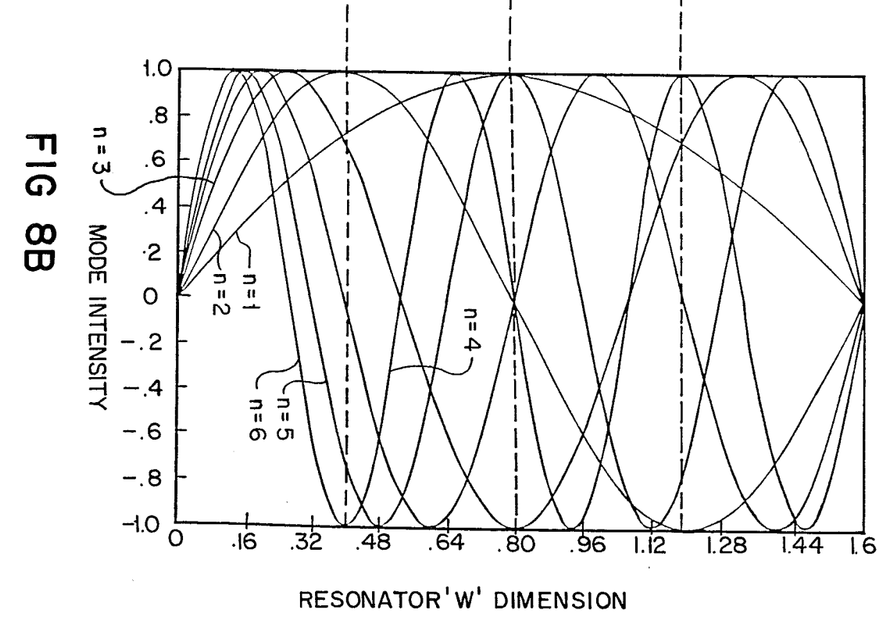
Figure 8C:
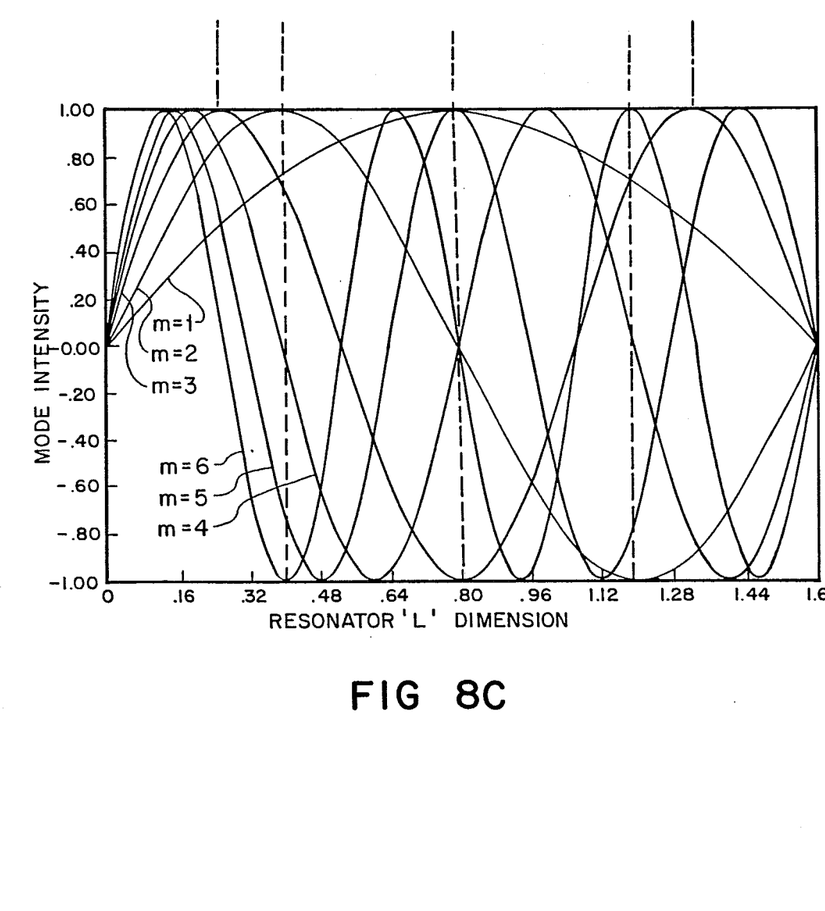
Figure 8D:
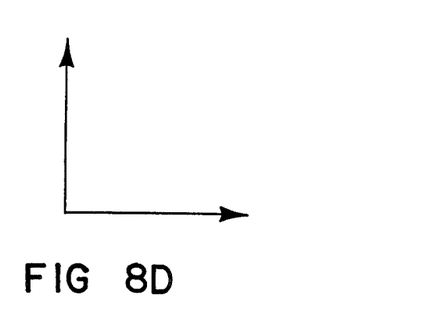

In FIG. 6 is shown a two-port transducer in which an input transducer 62 and an output transducer 63 are oriented at ninety degrees to one another and intersect over the center of a YIG block 61. In FIG. 7 is shown a further embodiment in which an input transducer 72 and an output transducer 73 intersect over the center of a YIG block 71. In the embodiments of FIGS. 6 and 7, the input transducer is located on the top side of the block of YIG film and the output transducer is located on the bottom side of the block of YIG film. In this manner, these two transducers can both pass over the location of the resonant peak without shorting to one another. In addition, to minimize the amount of direct transmission of electromagnetic waves between the two transducers, without mediation by the YIG film, the two transducers are preferably oriented at substantially ninety degrees to one another—that is, the lines A and B along the axes of the transducers are aligned along vector directions that are perpendicular to one another.

In the embodiment of FIG. 3, the mode of interest is selected to have more than one peak so that the input transducer can be located over one peak and the output transducer can be located over another peak. This enables both transducers to be located on the bottom of YIG block 31, thereby simplifying the production of the transducers—namely, the two transducers can be produced by forming a conductive layer and then etching it to produce both transducers in a single etch step. In this particular embodiment, the mode of interest is selected to be the (2,1) mode. As indicated by the dashed lines connecting FIGS. 3 and 4, transducers 33 and 34 are located substantially over the peaks of the (2,1) resonant mode.

When there are more than two peaks in the resonant mode of interest, then the input transducer should not only be located substantially over the center of a peak in the resonant mode of interest, it should also be positioned so that it is as far removed from peaks of the largest spurious modes so that the coupling into these largest spurious modes is reduced. This will reduce the strength of these spurious modes. Similarly, the amount of coupling of these largest spurious modes into the output signal is reduced by positioning the output transducer as far as possible away from the peaks of these largest spurious modes. In FIG. 4, it can be seen that if transducer is moved to the right a small amount, then it will more strongly couple to the (1,1) mode, but will couple more weakly to the (m,1) modes for m=3, ..., 6. Therefore, depending on which of these spurious modes are strongest, the spurious mode rejection can be improved by adjusting the center of transducer 33 somewhat to the right or left of dashed line 35. Likewise, the strength of these spurious modes in the output signal can be minimized by adjusting the position of transducer 34 somewhat to the left or right of dashed line 36.

The strength of the spurious components in the output signal can also be reduced by actively suppressing the strength of the spurious modes in the block of YIG film. This can be achieved by depositing a signal drain in the YIG block in locations over peaks in the spurious modes that are to be suppressed. A "signal drain" is any structure that drains an amount of energy from the MSW signal in the YIG block that increases with increase in signal at the location of the signal drain. For example, a block of conductive material at a point C on the top or bottom surface of the YIG block will couple to the MSW field at point C. Resistive loss in this block of conductive material will drain energy out of the MSW signal. Other types of signal drain structures include the deposition of conductive particles in the drain region or scratching the surface to introduce scattering/absorbing centers in the drain region.

It has also been found that etching the YIG film in the drain region to produce a shallow groove in the surface of the YIG film also produces a signal drain. This last indicated type of signal drain is preferred because all drain regions can be produced in a single photolithographic etch procedure. In addition, the depth and width and location of the drain regions can be very accurately controlled so that optimized choices of these parameters can be selected to optimize the suppression of the spurious resonant modes relative to the resonant mode of interest.

The magnetostatic wave resonant signal can be decomposed into a linear combination of the resonant modes of the resonant cavity. The signal drain will drain away energy in each mode individually. Therefore, the locations of the drain regions can be selected to discriminate against the spurious modes. More particularly, the drain regions should be selected so that they do not significantly overlap the peaks of the resonant modes of interest so that there is only a minimal amount of loss introduced into this mode. In addition, the locations of the drain regions should be selected to substantially overlap one or more peaks of those spurious modes to be suppressed. Typically, there are only a few spurious modes that significantly overlap in the frequency domain the resonant peak of the resonant mode of interest and have sufficient amplitude to significantly affect the resonant response near that resonant frequency of interest. These spurious modes will be referred to herein as the "major spurious modes" and will exceed some preselected threshold amplitude relative to the amplitude (in the frequency domain) of the resonant peak of interest. Therefore, the locations of the drain regions are selected to overlap one or more peaks of these major spurious modes.

Figure 9:
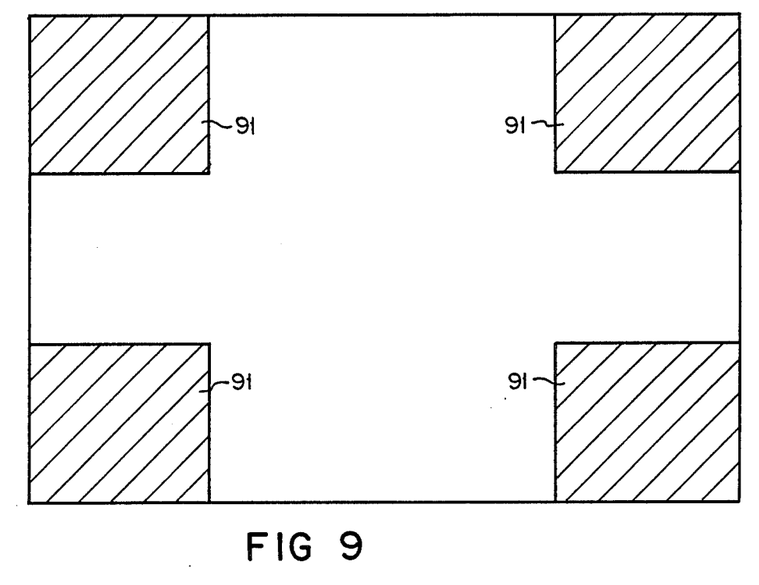
In FIG. 9 is shown an alternate embodiment of the resonator of FIG. 8A.

The selection of the locations of the drain regions is illustrated in FIGS. 8 and 8A-8D. Along the x-axis are shown the signals $\sin(m\pi x/L)$ and along the y-axis are shown the signals $\sin(n\pi y/W)$. If, for example, the resonant mode of interest in the (m,n)=(2,1), then the locations of the drain regions should be selected to lie outside of the crosshatches circles 81 which are located over the peaks of this mode. If the spurious mode (m,n)=(3,2) are to be suppressed, then the signal drains should be located over one or more of these regions enclosed by circles 82. The crosshatched grooves 83, 84 and 85 significantly overlaps all six peaks of the (3,2) mode and does not significantly overlap either of the peaks of the (2,1) mode. In addition, it can be seen that the pair of horizontal grooves 83 significantly overlap several peaks of each of the modes (m,n) for n=2, . . . , 6 and that the pair of vertical grooves 84 significantly overlaps several peaks of each of modes (m,n) for m=3, . . . ,6. Vertical groove 85 is included to suppress the (m,n) modes for m odd and in particular for m=1. In FIG. 9 is presented an embodiment in which a slot 91 is included to suppress the modes for odd values of m and in which four groove segments 91 are included to suppress the modes for m=3, . . . ,6 and for n=2, . . . ,6.

The depth of each of the grooves is on the order of 10--20 percent of the thickness of the ferrimagnetic film forming the resonant cavity. In general, if the depth is greater than this, then there will be sufficient reflections of the magnetostatic waves at the discontinuities at the edges of these grooves that they will tend to cause additional spurious resonance modes. If the depth is much less than this, then there is only a small damping effect.

We claim:

1. A magnetostatic wave resonator comprising:
a rectangular film of ferrimagnetic material having a set of walls that enclose a resonant cavity;
an input transducer for launching waves in said resonant cavity, said input transducer being located over a peak of a resonant mode of interest to strongly couple into that mode.

2. A resonator as in claim 1 further comprising an output transducer located over a peak of said resonant mode of interest to strongly couple out of said mode.

3. A resonator as in claim 2 wherein said input and output transducers are located over the same peak of said resonant mode of interest.

4. A resonator as in claim 2 wherein said resonant mode of interest contains a plurality of peaks and wherein said input and output transducers are located over different peaks of said resonant mode of interest.

5. A magnetostatic wave resonator as in claim 1 wherein said input transducer is a microstrip conductor at a first surface of said ferrimagnetic film.

6. A resonator as in claim 5 further comprising an output transducer consisting of a microstrip conductor at a second surface of said ferrimagnetic film and located over a peak of said resonant mode of interest to strongly couple electromagnetic energy out of said mode.

7. A resonator as in claim 6 wherein said input and output transducers are located over the same peak of said resonant mode of interest.

8. A resonator as in claim 5 wherein said resonant mode of interest contains a plurality of peaks, said resonator further comprising:
an output transducer consisting of a microstrip transducer at said first surface of said ferrimagnetic film, wherein said input and output transducers are located over different peaks of said resonant mode of interest.

9. A magnetostatic wave resonator as in claim 1, having at least one spurious mode, further comprising:
at least one signal drain located with respect to said resonant mode of interest and said at least one spurious mode to suppress said at least one spurious mode relative to said resonant mode of interest.

10. A resonator as in claim 9 wherein said input transducer is a microstrip conductor at a first surface of said ferrimagnetic film.

11. A resonator as in claim 10 wherein said signal drain comprises a block of conductive material at a surface of said ferrimagnetic film.

12. A resonator as in claim 10 wherein said signal drain comprises a patch of conductive particles on a surface of said ferrimagnetic film.

13. A resonator as in claim 10 wherein said signal drain comprises a patch of surface defects at a surface of said ferrimagnetic film.

14. A resonator as in claim 10 wherein said signal drain comprises a groove in a surface of said ferrimagnetic film.

15. A resonator as in claim 14 wherein each groove is parallel to a side of the ferrimagnetic film.

* * * * *